(12) United States Patent
Jung

(10) Patent No.: US 8,049,857 B2
(45) Date of Patent: Nov. 1, 2011

(54) LIQUID CRYSTAL DISPLAY DEVICE

(75) Inventor: Myung Woo Jung, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 560 days.

(21) Appl. No.: 12/318,051

(22) Filed: Dec. 19, 2008

(65) Prior Publication Data

US 2010/0073274 A1 Mar. 25, 2010

(30) Foreign Application Priority Data

Sep. 22, 2008 (KR) .................. 10-2008-0092930

(51) Int. Cl.
*G02F 1/1345* (2006.01)
(52) U.S. Cl. ......................................... 349/150; 349/58
(58) Field of Classification Search .................... 349/150
See application file for complete search history.

(56) References Cited

U.S. PATENT DOCUMENTS

2008/0291380 A1* 11/2008 Sakikubo ...................... 349/150
* cited by examiner

*Primary Examiner* — Richard Kim
(74) *Attorney, Agent, or Firm* — McKenna Long & Aldridge, LLP

(57) ABSTRACT

An LCD device includes: a backlight unit including a plurality of light emitting diodes (LEDs) which generate light, and emit the light to a liquid crystal panel; a main flexible circuit board on which driving circuits to drive the LEDs and the liquid crystal panel; a sub-flexible circuit board on which the LEDs are mounted and electrically connected to a wire pattern formed on the main flexible circuit board by being soldered to a side surface of the main flexible circuit board to electrically connect the light emitting diodes and the driving circuits for the light emitting diodes; and a support main encompassing the liquid crystal panel and the backlight unit and including a step portion at a side surface thereof to accommodate a soldering portion between the side surface of the main flexible circuit board and the sub-flexible circuit board which are connected by soldering.

4 Claims, 4 Drawing Sheets

LIQUID CRYSTAL DISPLAY DEVICE

This application claims the benefit of Korean Patent Application No. 10-2008-092930, filed on Sep. 22, 2008, which is hereby incorporated by reference for all purposes as if fully set forth herein

BACKGROUND OF THE INVENTION

1. Field of the Invention

The present invention relates to a liquid crystal display (LCD) device which may be manufactured to be compact and reduce a manufacturing cost.

2. Discussion of the Related Art

Cathode ray tubes (CRTs), one of widely used display devices, are mainly used as TVs or monitors for measuring apparatuses or information terminals. However, the heavy weight and large size of the CRT have been major hindrance to manufacturing of small and light electronic products.

As a solution to the above problem, LCD devices are gradually used in a wide range of application fields due to their advantages such as lightness, thinness, and low power consumption driving. Accordingly, the LCD device is being manufactured to have a larger screen, to be thinner, and to consume lower power.

The LCD device displays an image by controlling the amount of light transmitting liquid crystal. Since the LCD device is not a self-illuminating display device unlike the CRT, a backlight unit including a separate light source providing light is provided on a rear surface of an LCD panel to visually present an image.

Light emitting diodes (LEDs), cold cathode fluorescent lamps (CCFLs), and external electrode fluorescent lamps (EEFLs) are used as the light source of the backlight unit. Among these light sources, the LED that is a point light source is widely used for small LCD devices. In general, the LED that is mounted on a flexible printed circuit (FPC) which is advantageous for making the LCD device thinner is widely used for small LCD devices such as mobile phones. Also, driving circuits to drive the LED are mounted on the FPC.

The FPC on which the LED and the driving circuits for driving the LED are mounted is connected to a main FPC on which driving circuits such as a gate driver, a data driver, and a timing controller for driving an LCD panel are mounted, by soldering. When the main FPC and the FPC on which the LED and the LED driving circuits are mounted are connected by soldering, a soldering portion bulges higher than a bottom case. An insulation tape is attached to the soldering portion for the insulation of the soldering portion from an external system. Since the soldering portion bulges higher than the bottom case and the insulation tape is attached to the soldering portion, it is difficult to manufacture a thin LCD device.

SUMMARY OF THE INVENTION

Accordingly, the present invention is directed to a liquid crystal display device that substantially obviates one or more of the problems due to limitations and disadvantages of the related art.

An object of the embodiment of the present disclosure is to provide a LCD device which can be manufactured to be thin.

Another object of the embodiment of the present disclosure is to provide a LCD device which can reduce a manufacturing cost.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an LCD device includes: a backlight unit including a plurality of light emitting diodes which generate light, and emitting the light generated by the light emitting diodes to a liquid crystal panel; a main flexible circuit board on which driving circuits to drive the light emitting diodes and the liquid crystal panel; a sub-flexible circuit board on which the light emitting diodes are mounted, electrically connected to a wire pattern formed on the main flexible circuit board by being soldered to a side surface of the main flexible circuit board to electrically connect the light emitting diodes and the driving circuits for the light emitting diodes; and a support main encompassing the liquid crystal panel and the backlight unit and including a step portion at a side surface thereof to accommodate a soldering portion between the side surface of the main flexible circuit board and the sub-flexible circuit board which are connected by soldering.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to an embodiment of the present invention, example of which is illustrated in the accompanying drawings.

Figure 1:
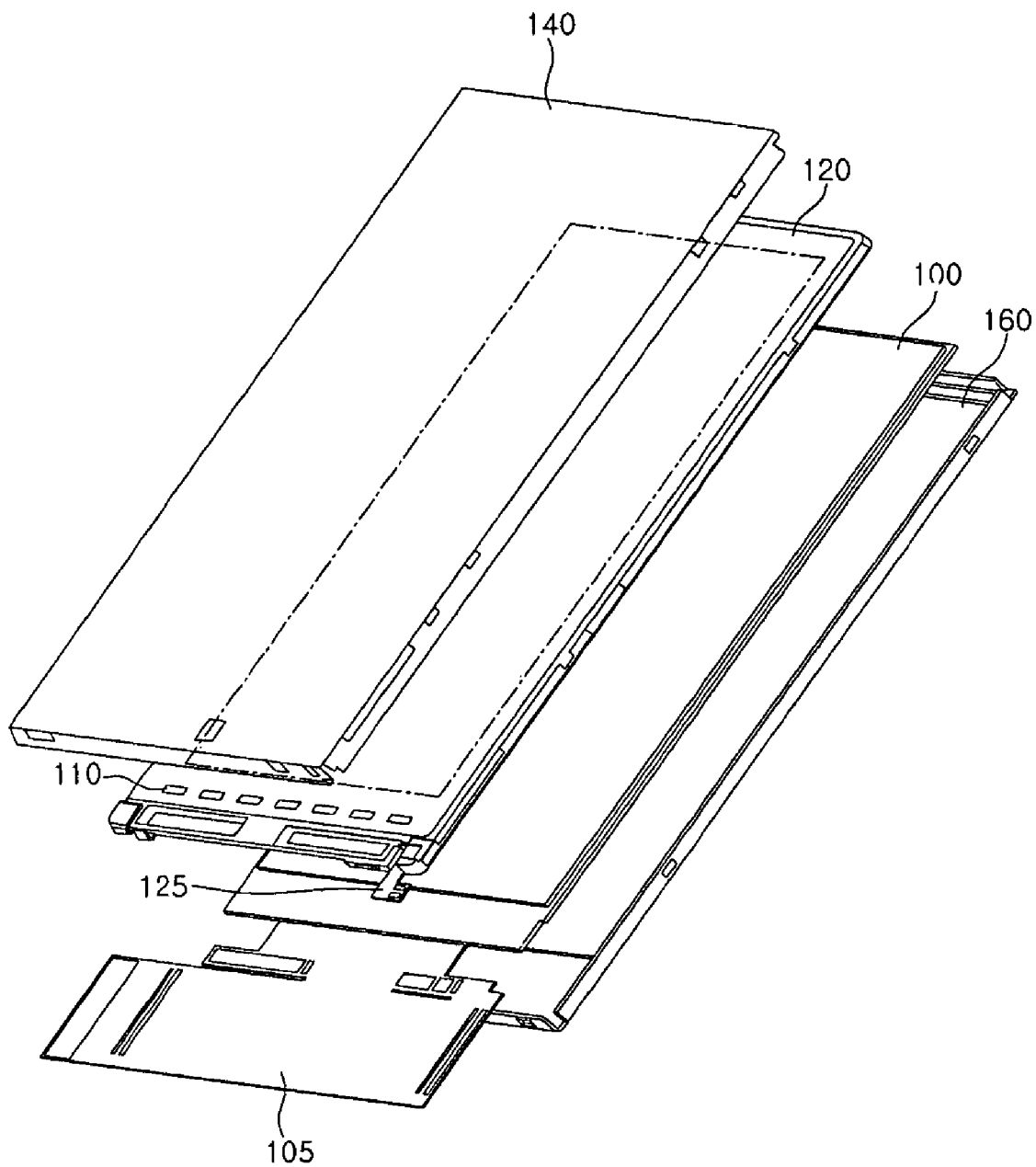
FIG. 1 is an exploded perspective view of an LCD device according to an embodiment of the present disclosure.
Figure 2:
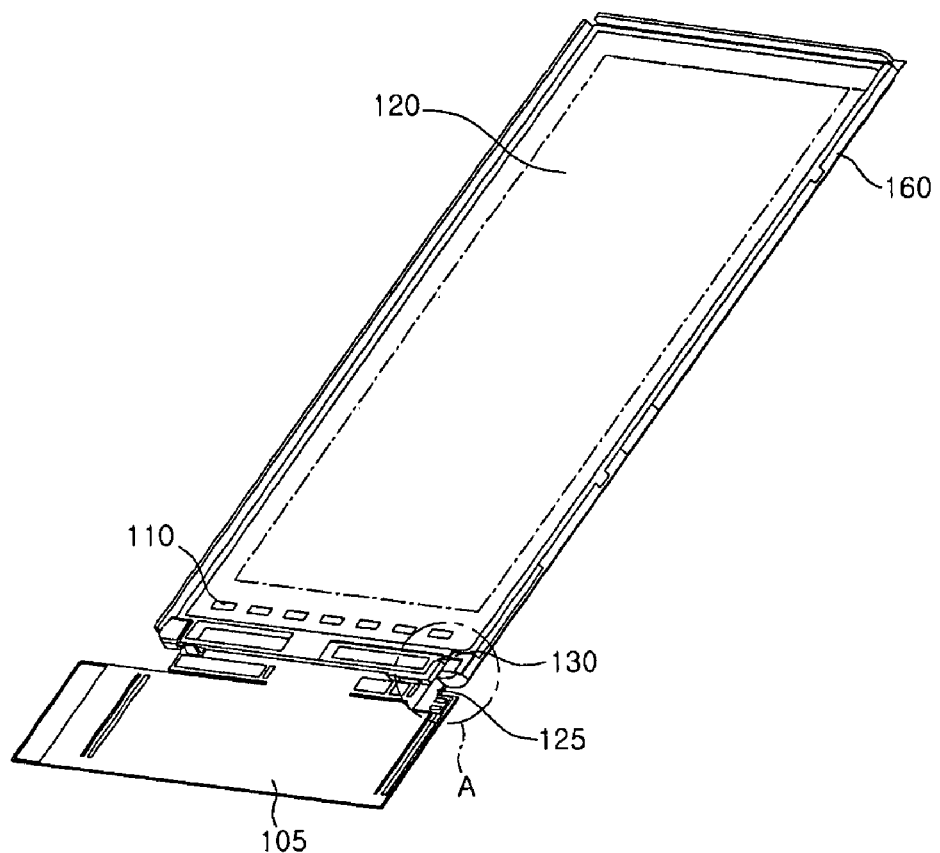
FIG. 2 is a perspective view showing that an LCD panel and a backlight unit are assembled to each other.
Figure 3:
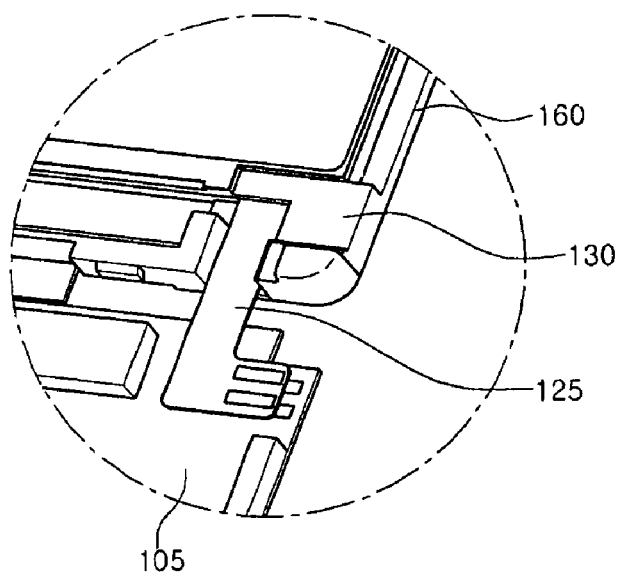
FIG. 3 is an enlarged perspective view of a portion A of FIG. 2.

FIG. 1 is an exploded perspective view of an LCD device according to an embodiment of the present disclosure. FIG. 2 is a perspective view showing that an LCD panel and a backlight unit are assembled to each other. FIG. 3 is an enlarged perspective view of a portion A of FIG. 2.

Referring to FIGS. 1-3, an LCD device includes a liquid crystal panel 100 displaying an image, a backlight unit 120 arranged on a lower surface of the liquid crystal panel 100, a bottom case 140 accommodating the liquid crystal panel 100 and the backlight unit 120, and a support main 160 encompassing the side surfaces of the liquid crystal panel 100, the backlight unit 120, and the bottom case 140.

The liquid crystal panel 100 includes a thin film transistor (TFT) substrate and a color filter substrate which are combined together to face each other and maintain a uniform cell gap, and a liquid crystal layer interposed between the two substrates.

A main flexible circuit board 105 on which a driving unit (not shown) supplying a drive signal to the liquid crystal panel 100 is attached to a side of the liquid crystal panel 100. According to the embodiment of the present invention, the present invention may be applied to a compact LCD device, such as for mobile phones. In the following description, the backlight unit 120 will be explained to put the case that it is applied to a compact LCD device mainly used for mobile phones.

The backlight unit 120 includes a plurality of light emitting diodes (LEDs) 110 arranged at a side of the backlight unit 120, a light guide panel (not shown) converting point lights of the LEDs 110 into a surface light, of optical sheets (not shown) arranged on the light guide panel and diffusing and focusing the light, and a reflection sheet (not shown) disposed on a lower surface of the light guide panel and reflecting the light applied from the lower surface of the light guide panel toward the light guide panel.

The backlight unit 120 further includes a sub-flexible circuit board 125 in which the plurality of the LEDs 110 may be arranged at a constant interval. The sub-flexible circuit board 125 is electrically connected to the main flexible circuit board 105 attached to the side of the liquid crystal panel 100 and drives the LEDs 110.

The LEDs 110 may include a white LED emitting a white light or a combination of red, green, and blue LEDs respectively emitting red, green, and blue lights. The main flexible circuit board 105 and the sub-flexible circuit board 125 are obtained by forming a complicated circuit on an insulation film and formed of an anti-thermal plastic film that is a flexible material such as polyester (PET) or polyimide (PI).

Driving circuits for driving the liquid crystal panel 100, for example, a gate driving circuit, a data driving circuit, and a timing controller, and driving circuits for driving the LEDs 110, are mounted on the main flexible circuit board 105. The side surface of the main flexible circuit board 105 is electrically connected to the side surface of the sub-flexible circuit board 125 by soldering.

The bottom case 140 accommodates the liquid crystal panel 100 and the backlight unit 120 in order and prevents the liquid crystal panel 100 and the backlight unit 120 from being scratched by external foreign materials.

The support main 160 encompasses the side surface of the bottom case 140 accommodating the liquid crystal panel 100 and the backlight unit 120 to make a single module. A step portion 130, that is a portion inwardly stepped as large as the thickness of a soldering portion between the main flexible circuit board 105 and the sub-flexible circuit board 125 which are connected by soldering, is formed at a side surface of the support main 160 to correspond to the soldering portion. Accordingly, the soldering portion between the main flexible circuit board 105 and the sub-flexible circuit board 125 is bent to be seated in the step portion 130 formed in the support main 160.

The step portion 130 formed at the side surface of the support main 160 may have the same shape as or a shape corresponding to that of the soldering portion between the main flexible circuit board 105 and the sub-flexible circuit board 125. The structure of the step portion 130 of the support main 160 provided in the LCD device according to the present embodiment may be variously modified on the condition that the shape of the step portion 130 corresponds to the soldering portion between the main flexible circuit board 105 and the sub-flexible circuit board 125.

Figure 4:
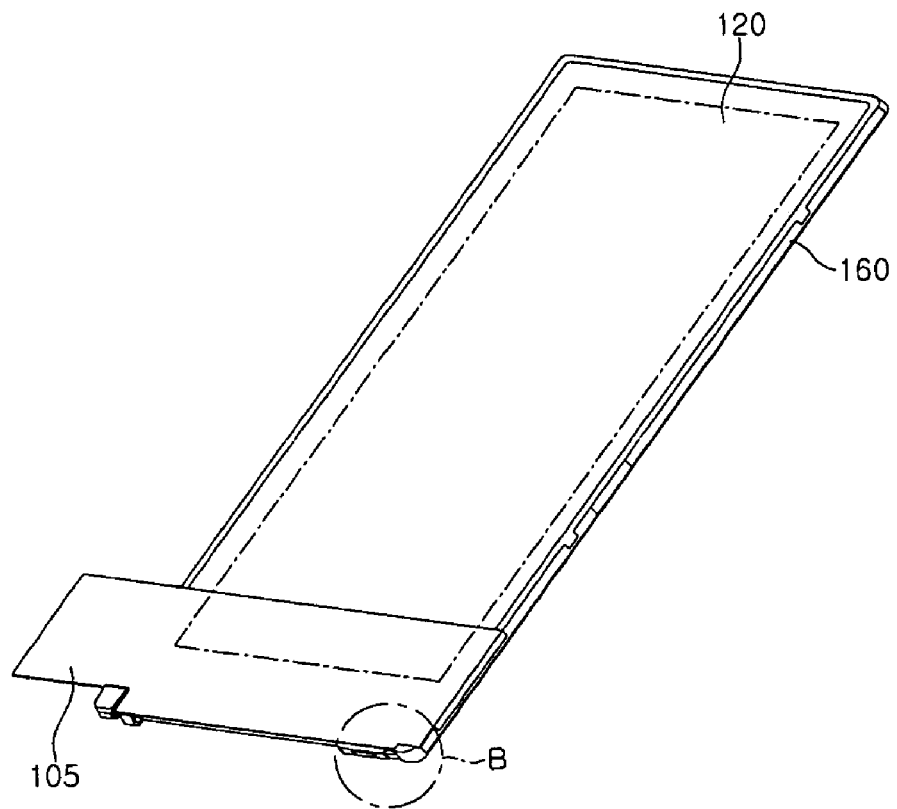
FIG. 4 is a perspective view showing that a main FPC is bent toward a rear surface of a backlight unit.
Figure 5:
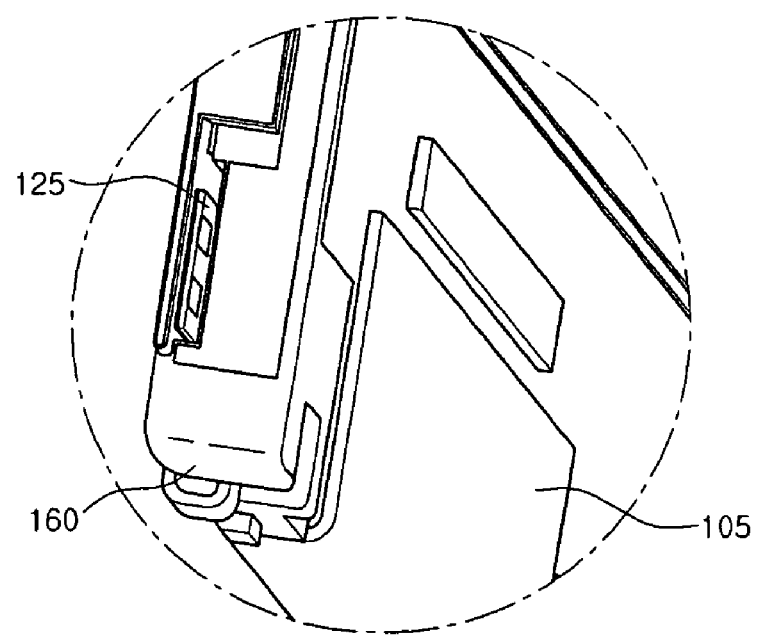
FIG. 5 is an enlarged perspective view of a portion B of FIG. 4.
Figure 6:
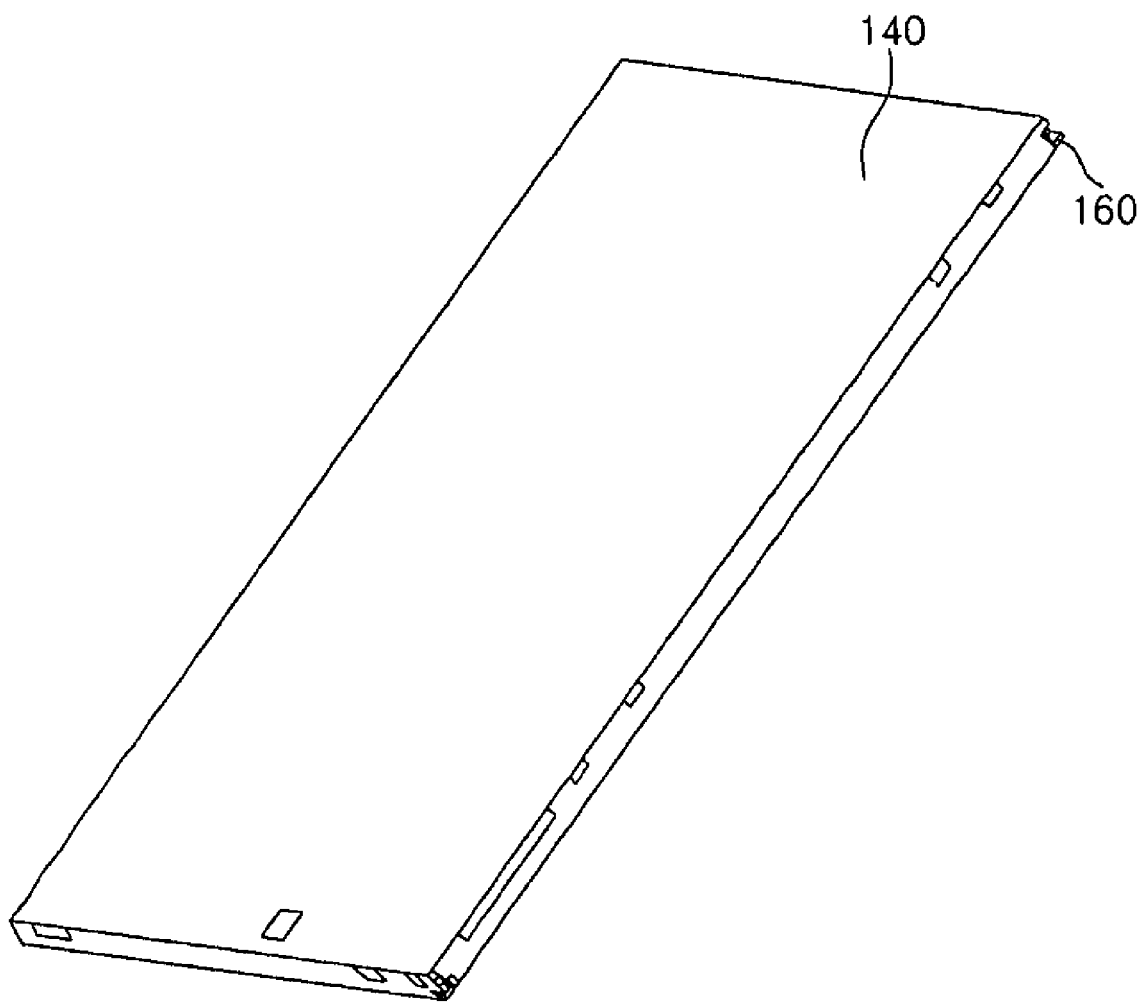
FIG. 6 is a perspective view showing that the LCD device of FIG. 1 is assembled.

FIG. 4 is a perspective view showing that a main FPC is bent toward a rear surface of a backlight unit. FIG. 5 is an enlarged perspective view of a portion B of FIG. 4. FIG. 6 is a perspective view showing that the LCD device of FIG. 1 is assembled. Referring to FIGS. 4-6, the main flexible circuit board 105 is soldered to the sub-flexible circuit board 125 of FIG. 1 and thus accommodated in the bottom case 140 by being bent toward the rear surface of the backlight unit 120.

As described above, when the main flexible circuit board 105 is bent toward the rear surface of the backlight unit 120, the soldering portion between the main flexible circuit board 105 and the sub-flexible circuit board 125 is correspondingly seated in the step portion 130 of the support main 160. Accordingly, the soldering portion between the main flexible circuit board 105 and the sub-flexible circuit board 125 is not exposed to the outside of the bottom case 140.

Thus, since the soldering portion between the main flexible circuit board 105 and the sub-flexible circuit board 125 is not externally exposed, there is no need to attach a separate insulation tape to the soldering portion for the insulation of an external system so that the LCD device may reduce a manufacturing cost. Also, since the soldering portion between the main flexible circuit board 105 and the sub-flexible circuit board 125 is positioned inside the bottom case 140, the LCD device may be manufactured to be thin.

As described above, since the main flexible circuit board on which driving circuits are mounted and a portion of the sub-flexible circuit board on which light emitting diodes are mounted are connected by soldering and the soldering portion is correspondingly seated in the step portion formed in the support main, the LCD device may be manufactured to be thin. Also, since the soldering portion between the main flexible circuit board and a portion of the sub-flexible circuit board is not fixed using a separate insulation tape, a manufacturing cost may be reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An LCD display device comprising:
    a backlight unit including a plurality of light emitting diodes which generate light, and emitting the light generated by the light emitting diodes to a liquid crystal panel;
    a main flexible circuit board on which driving circuits to drive the light emitting diodes and the liquid crystal panel;
    a sub-flexible circuit board on which the light emitting diodes are mounted, electrically connected to a wire pattern formed on the main flexible circuit board by being soldered to a side surface of the main flexible circuit board to electrically connect the light emitting diodes and the driving circuits for the light emitting diodes; and
    a support main encompassing the liquid crystal panel and the backlight unit and including a step portion at a side surface thereof to accommodate a soldering portion between the side surface of the main flexible circuit board and the sub-flexible circuit board which are connected by soldering.

2. The LCD display device claimed as claim 1, wherein the step portion is formed inwardly in the support main as large as a thickness of the soldering portion between the main flexible circuit board and the sub-flexible circuit board.

3. The LCD display device claimed as claim 1, further comprising a bottom case contacting the inner surfaces of the main flexible circuit board and sub-flexible circuit board which are connected with each other by soldering and are bent.

4. The LCD display device claimed as claim 1, wherein the step portion is formed to have a shape of the soldering portion connecting the main flexible circuit board with the sub-flexible circuit board.

* * * * *